United States Patent
Kang

(10) Patent No.: US 7,253,394 B2
(45) Date of Patent: Aug. 7, 2007

(54) IMAGE SENSOR AND METHOD FOR FABRICATING THE SAME

(75) Inventor: Shinill Kang, 102-1107, Daerim Apartment, Daebang-dong, Dongjak-ku, Seoul 156-020 (KR)

(73) Assignees: Shinill Kang, Seoul (KR); Optomecha Co., Ltd., Seoul (KR)

( * ) Notice: Subject to any disclaimer, the term of this patent is extended or adjusted under 35 U.S.C. 154(b) by 0 days.

(21) Appl. No.: 10/566,015

(22) PCT Filed: Mar. 30, 2004

(86) PCT No.: PCT/KR2004/000729

§ 371 (c)(1),
(2), (4) Date: Jan. 23, 2006

(87) PCT Pub. No.: WO2005/008781

PCT Pub. Date: Jan. 27, 2005

(65) Prior Publication Data

US 2007/0053037 A1 Mar. 8, 2007

(30) Foreign Application Priority Data

Jul. 21, 2003 (KR) .................... 10-2003-0049859

(51) Int. Cl.
*H01J 3/14* (2006.01)
*H01L 27/00* (2006.01)

(52) U.S. Cl. .................. 250/216; 250/208.1; 359/619; 257/432

(58) Field of Classification Search ........... 250/216, 250/208.1, 214.1; 359/619, 621, 626, 628; 257/294, 432
See application file for complete search history.

(56) References Cited

U.S. PATENT DOCUMENTS 5,902,997 A * 5/1999 Kropp ...................... 250/216

(Continued)

FOREIGN PATENT DOCUMENTS

JP 07-014997 1/1995

(Continued)

OTHER PUBLICATIONS

English Language Abstract of Japanese Publication No. JP2003015275, published Jan. 15, 2003.

(Continued)

*Primary Examiner*—Kevin Pyo
(74) *Attorney, Agent, or Firm*—Marger Johnson & McCollom, P.C.

(57) ABSTRACT

An image sensor includes a substrate in which photoelectric elements have been formed, and an array of optical path conversion elements formed at a light so that the optical path converted light may be incident on the substrate, wherein each of the optical path conversion elements has different tangent line gradients on the corresponding parts of incident surfaces according to distances from the center of the image sensor in order to compensate for differences of incident angles of incident light according to the distances from the center of the image sensor. In addition, a method for fabricating the image sensor fabricates the optical path conversion elements according to a photolithography process using a gray scale mask, combinations of the photolithography process and a reactive ion etching process, or combinations of the photolithography process, the reactive ion etching process, and an UV-molding process.

12 Claims, 16 Drawing Sheets

Central area    Peripheral area

U.S. PATENT DOCUMENTS

| | | | |
|---|---|---|---|
| 6,008,511 A | 12/1999 | Tokumitsu et al. | |
| 6,033,766 A | 3/2000 | Block et al. | |
| 6,043,481 A * | 3/2000 | Tan et al. | 250/216 |
| 6,518,640 B2 | 2/2003 | Suzuki et al. | |
| 6,556,349 B2 | 4/2003 | Cox et al. | |

FOREIGN PATENT DOCUMENTS

| | | |
|---|---|---|
| JP | 08-043605 | 2/1996 |
| JP | 2003015275 | 1/2003 |
| KR | 1020030010148 A | 2/2003 |

OTHER PUBLICATIONS

English Language Abstract of Japanese Publication No. JP07-014997, published Jan. 17, 1995.

English Language Abstract of Japanese Publication No. JP08-043605, published Feb. 16, 1996.

English Language Abstract of Korean Publication No. KR1020030010148A, published Feb. 5, 2003.

* cited by examiner

Central area    Peripheral area

Central area     Peripheral area

Central area     Peripheral area

Central area    Peripheral area

Central area    Peripheral area

Central area      Peripheral area

Central area     Peripheral area

Central area     Peripheral area

IMAGE SENSOR AND METHOD FOR FABRICATING THE SAME

CROSS-REFERENCE TO RELATED PATENT APPLICATION

This application claims the benefit of Korean Patent Application No. 2003-0049859, filed on Jul. 21, 2003, in the Korean Intellectual Property Office and International Application No. PCT/KR2004/000729, filed on Mar. 30, 2004, the disclosures of which are incorporated herein in their entirety by reference.

1. Field of the Invention

The present invention relates to an image sensor and a method for fabricating the same, and more particularly to, an image sensor and a method for fabricating the same, which can make intensive and homogeneous light sensed in every position of the image sensor.

2. Description of the Related Art

An image sensor such as a CCD or CMOS has been used for various products including a digital camera, a digital camcorder, a CCTV, etc. The image sensor is used together with lenses in order to improve performance of the products. There have been increasing demands of consumers on high performance and miniaturization of the image sensor. Thus, researches have been made to develop a high performance miniaturized image sensor.

FIG. 1 illustrates a basic structure of a conventional image sensor, which does not have an array of micro lenses 5.

Referring to FIG. 1, an electric circuit including photoelectric elements 1 is formed on a substrate 3 of the image sensor. When light passing through a lens system 6 is incident on the substrate 3, the photoelectric elements 1 sense the light and convert the light into an electric signal, to capture images.

A color image sensor includes color filters 2. The color filters 2 transmit a specific wavelength of light. Photodiodes are generally used as the photoelectric elements 1.

The substrate 3 may include a variety of composite layers. In order to simplify explanations of the invention, the substrate 3 is presumed to have a silicon chip layer 3a and a color filter layer 3b. Here, the photoelectric elements 1 are formed on the silicon chip layer 3a and the color filters 2 are formed on the color filter layer 3b.

Sensitivity of the image sensor is very dependent upon an amount of light incident on the photoelectric elements 1 for sensing light. However, in the image sensor of FIG. 1, an amount of light sensed by photoelectric elements 1 having small area is not much, which reduces optical efficiency. Accordingly, micro lenses 5 are used to condense light to the photoelectric elements 1. As a result, the amount of sensed light is increased, to improve optical efficiency of the image sensor.

FIG. 2 illustrates a basic structure of a conventional image sensor including an array of micro lenses 5. According to high miniaturization and integration of the image sensor, the micro lenses 5 have been gradually recognized as essential elements for improving performance of the image sensor. Nevertheless, image sensors, which do not include micro lenses, are also useful in the low priced image sensor market.

FIG. 3 illustrates one example of a system using an image sensor 8 (for example, digital camera).

As illustrated in FIG. 3, the system using the image sensor 8 includes the image sensor 8, a lens system 6 having single or plural lenses, and a protective glass 7 for protecting the image sensor 8.

FIG. 4 illustrates low optical efficiency of peripheral pixels of the image sensor of FIG. 2.

The most important factor of the system using the image sensor 8 is whether the photoelectric elements 1 of the image sensor 8 can efficiently sense incident light.

In the central area 8a of the image sensor 8, light is incident on the image sensor along an optical axis, passes through the micro lenses 5 and the color filters 2, and is efficiently sensed by the photoelectric elements 1.

Conversely, in the peripheral areas 8b and 8c of the image sensor 8, light slanted to the optical axis is incident on the image sensor 8, passes through the micro lenses 5 and the color filters 2, and is incident on the photoelectric elements 1. Here, the amount of light is smaller in the peripheral areas 8b and 8c than the central area 8a.

That is, the amount of sensed light is very different in the central area 8a and the peripheral areas 8b and 8c of the image sensor 8. Therefore, images captured in the peripheral areas 8b and 8c are more darkened than those in the central area 8a. In the worst case, images may not be captured in the peripheral areas 8b and 8c.

Accordingly, a lot of researches have been made to efficiently condense light passing through the micro lenses 5 to the photoelectric elements 1 without loss.

As the first method for efficiently condensing light, a large size lens system 6 for reducing an angle of light incident on the image sensor was used to improve optical efficiency. However, this requires many lenses to be used for aberration correction and thus increases a size of the whole system. It runs against the miniaturization tendency of the system.

The second to fourth methods will be explained with reference to FIGS. 5 to 7.

FIG. 5 illustrates another example of the conventional image sensor. As shown in FIG. 5, micro lenses 5 are arranged on different planes according to distances from the center of the image sensor.

Such an image sensor has been disclosed in U.S. Pat. No. 6,556,349.

This method is very efficient to correct spherical aberrations generated by a lens system 6. However, as compared with FIG. 4, an angle of light refracted by the micro lenses 5 is the same in the peripheral areas, but distances between the micro lenses 5 and the photoelectric elements 1 are increased. Thus, light is condensed separately from the photoelectric elements 1.

FIG. 6 illustrates yet another example of the conventional image sensor. As depicted in FIG. 6, micro lenses 5 of different sizes are arranged according to distances from the center of the image sensor.

Such an image sensor has been disclosed in Korean Unexamined Patent Publication 2003-0010148 and U.S. Pat. No. 6,556,349.

This method increases a fill factor in the area in which light is incident on the surface of the image sensor at a large angle to an optical axis, and decreases the fill factor in the area in which light is incident at a small angle to the optical axis, to equalize amounts of light sensed by every photoelectric element 1.

However, a large size micro lens 5 has a greater radius of curvature than a small size micro lens 5. In addition, a focal distance of the large size micro lens 5 is increased, to restrict refraction. Accordingly, light condensed by the large size micro lens 5 forms a focus farther than the small size micro lens 5, and is condensed separately from the photoelectric elements 1.

FIG. 7 illustrates yet another example of the conventional image sensor. As illustrated in FIG. 7, micro lenses 5 are arranged in deviated positions from photoelectric elements 1 according to distances from the center of the image sensor.

Such an image sensor has been disclosed in U.S. Pat. Nos. 6,518,640 and 6,008,511.

In order to prevent light from being condensed outside the photoelectric elements 1 as shown in the methods of FIGS. 5 and 6, the method of FIG. 7 moves the micro lenses 5, to condense light to the photoelectric elements 1. However, when light is incident at a relatively large angle, it is intercepted by the other structures on a substrate 3. Therefore, an amount of sensed light is reduced. Moreover, intervals between the micro lenses 5 are different in the central area and the peripheral area of the image sensor, which complicates the fabrication process.

That is, the conventional methods for improving optical efficiency stick to resultant phenomena, instead of seeking countermeasures on the basis of basic principles, and thus make little improvements in optical efficiency.

DISCLOSURE OF THE INVENTION

An object of the present invention is to change a structure of an image sensor to prevent brightness and resolution of captured images from being reduced because amounts of light sensed by photoelectric elements are small in some positions in the image sensor.

That is, the object of the present invention is to improve efficiency of the image sensor by making very intensive and homogeneous light sensed in every position in the image sensor, when light from a lens system passes through a color filter layer of a substrate and is sensed by the photoelectric elements.

The present invention takes notice of radical reasons of problems of the conventional image sensor, and solves the problems to raise efficiency of the image sensor. The conventional methods stick to resultant phenomena rather than radical countermeasures, and thus rarely improve efficiency of the image sensor. However, the present invention can considerably improve efficiency of the image sensor.

For this, the present invention is based on two very simple principles.

The first principle can be obtained from consideration of problems of the conventional image sensor that efficiency is bad. The optical efficiency of the conventional image sensor is reduced because light is slantingly incident on micro lenses.

Accordingly, the present invention makes light incident on the micro lenses at a right angle, or makes the micro lenses themselves perform this function (aspheric micro lenses). It is very meaningful that light is incident at a right angle. It implies that light is incident at a right angle on the micro lenses of peripheral pixels of the image sensor as well as the micro lenses of central pixels.

The second principle relates to a way of embodying the first principle, namely a way for making light incident on the surface of the image sensor at a right angle. Here, the present invention uses the Snell's law, a refraction law for controlling refractions when light passes through the interface between different media, and also uses the reflection law.

An optical path of light is changed due to refraction or reflection. Here, let's presume that the optical path of light slantingly incident on the peripheral pixels of the image sensor is changed by a refraction or reflection element and then light is incident on the micro lenses at a right angle.

Because light is incident on the micro lenses at a right angle, an angle of light refracted or reflected by the refraction or reflection element can be regarded as a fixed value.

Therefore, we can consider that an inclination angle of light incident on the refraction or reflection element and a gradient value of an incident surface of the refraction or reflection element are mutually dependent variables.

That is, when the inclination angle of light is changed, the gradient value of the incident surface has to be changed, to keep refracted or reflected light parallel to an optical axis. It implies that the present invention can make refracted or reflected light parallel to the optical axis by using optical path conversion elements which have different tangent line gradients on the corresponding parts of the incident surfaces according to distances between the corresponding parts and the center of the image sensor.

The present invention originates from these very simple but important radical principles, which will later be explained in more detail with reference to FIGS. 8 to 10 and FIGS. 14 to 16.

In order to achieve the above-described object of the invention, there is provided an image sensor comprising: a substrate in which an array of photoelectric elements is formed; and an array of optical path conversion elements for converting optical paths of incident light formed at a light incident side of the substrate so that the optical path converted light may be incident on the substrate, each optical path conversion element being formed to match with each photoelectric element, wherein an incident surface of each optical path conversion element has a tangent line gradient value to convert the optical path of light incident slantingly on a peripheral area of the image sensor at a larger inclination angle as the peripheral area is away from the center of the image sensor to be identical with the optical path of light incident vertically on a central area of the image sensor to counterbalance the inclination angle of light incident on the peripheral area of the image sensor, the tangent line gradient values of corresponding parts of the incident surfaces of the optical path conversion elements at an identical distance from the respective matching photoelectric elements being different from one another according to distances between the corresponding parts and the center of the image sensor.

Preferably, the optical path conversion elements are micro prisms or micro reflecting mirrors having different incident surface gradients values according to the distances from the center of the image sensor.

Here, the single image sensor can include both the micro prism type optical path conversion elements and the micro reflecting mirror type optical path conversion elements.

In addition, the single optical path conversion element can include combinations of a plurality of micro prisms.

The micro prism type optical path conversion elements and the flat surface micro reflecting mirror type optical path conversion elements convert the optical path of light to be parallel to the optical axis.

Preferably, the image sensor includes micro lenses, and the micro lenses are positioned in the optical path of light converted by the optical path conversion elements, for condensing light to the photoelectric elements.

Preferably, the optical path conversion elements are aspheric micro lenses or aspheric micro reflecting mirrors.

The single image sensor can include both the aspheric micro lens type optical path conversion elements and the aspheric micro reflecting mirror type optical path conversion elements.

Preferably, the optical path conversion elements are so positioned that the centers of the optical path conversion elements are offset from the centers of the photoelectric elements according to the distances from the center of the single image sensor.

Preferably, when the image sensor is divided into a plurality of regions according to the distances from its center, the optical path conversion elements in the same region have the identical tangent line gradient value on the corresponding parts of the incident surfaces, but the optical path conversion elements in the different regions have different tangent line gradient values on the corresponding parts of the incident surfaces according to the distances between the corresponding parts and the center of the image sensor.

According to another aspect of the invention, there is provided a method for fabricating an image sensor in which optical path conversion elements are formed according to a photolithography process using a gray scale mask, combinations of the photolithography process and a reactive ion etching process, or combinations of the photolithography process, the reactive ion etching process, and an UV-molding process.

BRIEF DESCRIPTION OF THE DRAWINGS

FIGS. 11a and 11b illustrate image sensors including an array of micro prisms as optical path conversion elements in accordance with one embodiment of the present invention, wherein FIG. 11a shows the image sensor including a single array of micro prisms, and FIG. 11b shows the image sensor including a double array of micro prisms;

FIGS. 21a and 21b illustrate simulation results for the image sensor including the array of micro lenses in FIG. 2, wherein FIG. 21a shows an optical path of light, and FIG. 21b shows distribution of light intensity in photoelectric element; and FIGS. 22a and 22b illustrate simulation results for the image sensor including the array of micro prisms and the array of micro lenses in FIG. 12, wherein FIG. 22a shows an optical path of light, and FIG. 22b shows distribution of light intensity in photoelectric element.

BEST MODE FOR CARRYING OUT THE INVENTION

An image sensor and a method for fabricating the same in accordance with preferred embodiments of the present invention will now be described in detail with reference to the accompanying drawings.

Figure 8:
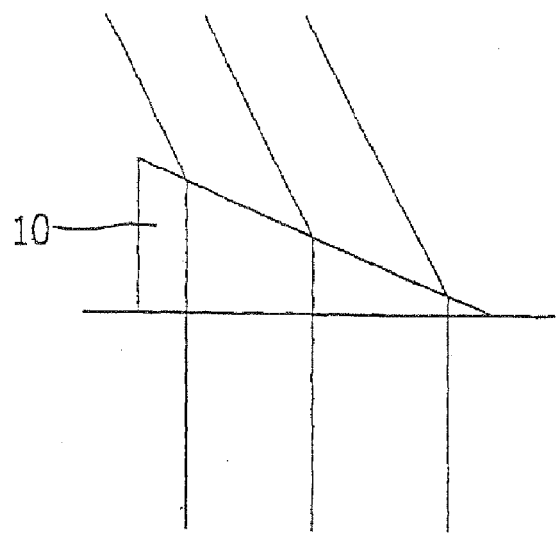
FIG. 8 is a concept view showing that a prism can vary an optical path of light.

FIG. 8 is a concept view showing that a prism 10 can vary an optical path of light.

As illustrated in FIG. 8, the micro prism 10 converts the optical path of light to be parallel to an optical axis in order to prevent reduction of optical efficiency due to light slantingly incident on peripheral pixels of an image sensor.

The relations between an inclination angle of light incident on the surface of the prism 10, an angle of refracted light and a gradient value of an incident surface of the prism 10 will now be explained with reference to FIG. 9.

Figure 9:
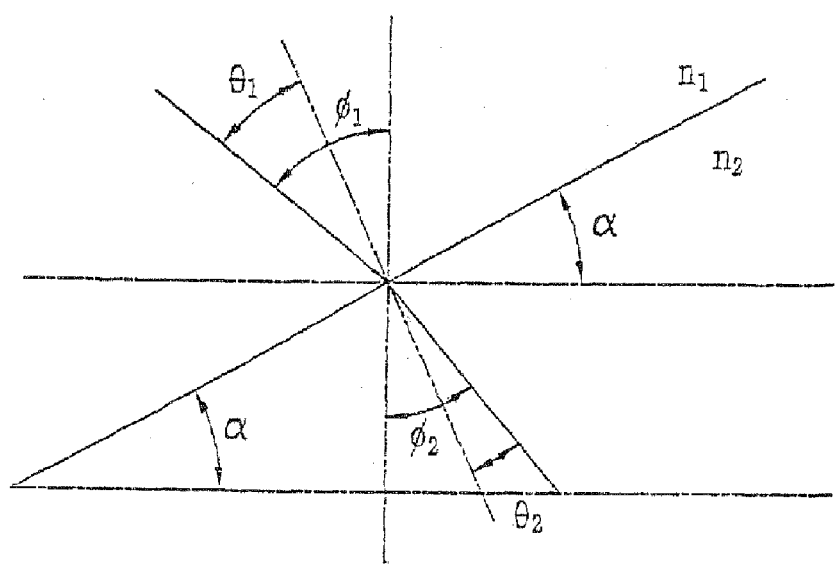
FIG. 9 illustrates the refraction law of light, especially light passing through the prism of FIG. 8.

FIG. 9 illustrates the refraction law of light, especially light passing through the prism 8 of FIG. 8.

FIG. 9 shows a refraction path of light when light is incident on an interface between different media having a gradient of '$\alpha$'. When it is presumed that an angle of incident light to a normal line of the interface is '$\theta_1$', an angle of refracted light to the normal line of the interface is '$\theta_2$', a refraction index of the medium in the incident side is '$n_1$' and a refraction index of the medium in the refraction side is '$n_2$', the Snell's law is represented by following formula (1):

$$n_1 \sin \theta_1 = n_2 \sin \theta_2 \qquad (1)$$

Here, when it is presumed that the gradient of the interface is '$\alpha$', an inclination angle of incident light to the optical axis is '$\phi_1$' and an angle of refracted light to the optical axis is '$\phi_2$', and they are introduced to formula (1), we can obtain following formula (2):

$$\tan \alpha = \frac{n_1 \sin \phi_1 - n_2 \sin \phi_2}{n_1 \cos \phi_1 - n_2 \cos \phi_2} \qquad (2)$$

In case that light is vertically refracted ($\phi_2=0$) through the surface of the prism 10, the gradient α of the incident surface of the prism 10 is represented by following formula (3) with regard to the inclination angle $\phi_1$ of incident light and the refraction indexes $n_1$ and $n_2$ of the media:

$$\alpha = \tan^{-1}\left(\frac{n_1 \sin \phi_1}{n_1 \cos \phi_1 - n_2}\right) \qquad (3)$$

Figure 10:
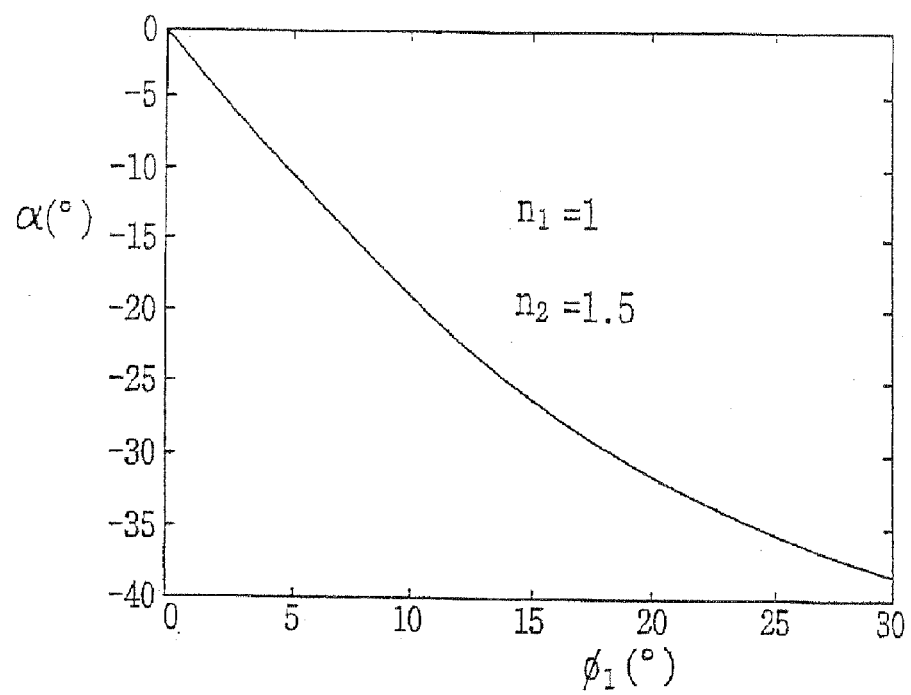
FIG. 10 illustrates relations between an inclination angle and a gradient value of an incident surface for making light refracted by the prism parallel to an optical axis.

FIG. 10 illustrates relations between the inclination angle and the gradient value of the incident surface for making light refracted by the prism 8 parallel to the optical axis.

FIG. 10 shows the gradient α of the incident surface of the prism 10 according to the inclination angle $\phi_1$ of light incident on the incident surface of the prism 10 for making refracted light parallel to the optical axis, when the refraction index of the medium in the incident side is '1' and the refraction index of the medium in the refraction side is '1.5'.

Here, two points must be noted.

First, as the inclination angle $\phi_1$ increases, that is, in the peripheral pixels of the image sensor, the gradient of the incident surface of the prism 10 increases in the negative direction, which will later be explained with reference to FIG. 11a.

Second, when the refraction index of the prism 10 is larger than that of the medium in the incident side, the gradient of the incident surface of the prism 10 has a negative value, and reversely, when the refraction index of the prism 10 is smaller than that of the medium in the incident side, the gradient of the incident surface of the prism 10 has a positive value, which will later be explained with reference to FIG. 11b.

Figure 11A:
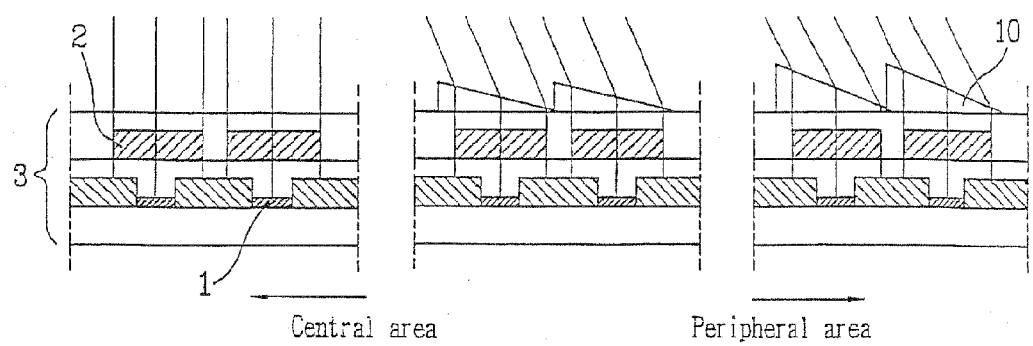
Figure 11B:
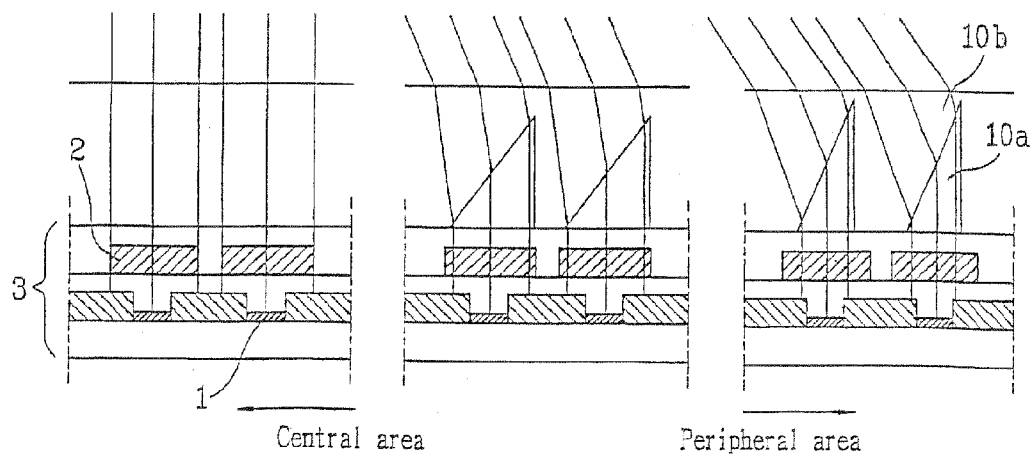

FIGS. 11a and 11b illustrate image sensors including an array of micro prisms 10 as optical path conversion elements in accordance with one embodiment of the present invention. Here, FIG. 11a shows the image sensor including a single array of micro prisms 10, and FIG. 11b shows the image sensor including a double array of micro prisms 10a and 10b.

FIGS. 11a and 11b show that the array of micro prisms 10 having different incident surface gradients can make light incident at different angles on each pixel refracted parallel to an optical axis.

This method equalizes angles of light incident on photoelectric elements 1 of the image sensor, and thus equalizes amounts of light sensed in each position of the image sensor.

The structure of FIG. 11a includes an air layer and a prism layer. The prism layer has a higher refraction index than the air layer, and thus the incident surface of the prism 10 faces the right side.

Conversely, as shown in FIG. 11b, when the second micro prism 10b contacting the air layer has a higher refraction index than the first micro prism 10a, the incident surface of the first micro prism 10a faces the left side. The second micro prism 10b can be formed in various shapes to refract light. Here, FIG. 11b exemplifies the flat layer type second micro prism 10b formed on the first micro prism 10a. The incident surface of the first micro prism 10a has a gradient to the right angle surface to the optical axis, and the incident surface of the second micro prism 10b is at right angles to the optical axis.

Figure 12:
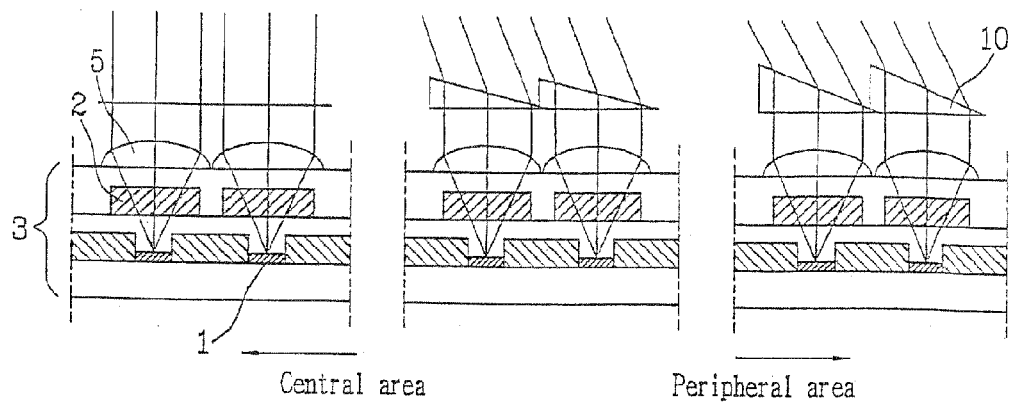
FIG. 12 illustrates an image sensor including an array of micro prisms and an array of micro lenses as optical path, conversion elements in accordance with another embodiment of the present invention.

FIG. 12 illustrates an image sensor including an array of micro prisms 10 and an array of micro lenses 5 as optical path conversion elements in accordance with another embodiment of the present invention.

As depicted in FIG. 12, the image sensor uses both the array of micro prisms 10 and the array of micro lenses 5. Here, the array of micro prisms 10 convert an optical path of light to be parallel to an optical axis, and the array of micro lenses 5 condense light to photoelectric elements 1. Accordingly, the method of FIG. 12 more efficiently senses light than the methods of FIGS. 11a and 11b, and equalizes amounts of light sensed in each position.

That is, the image sensors of FIGS. 11a to 12 are fabricated by additionally arranging micro prisms on the general image sensor, to improve optical efficiency. In addition, the image sensor of the invention can be easily fabricated by using gray scale masks of FIGS. 20a to 20c discussed later.

Figure 13:
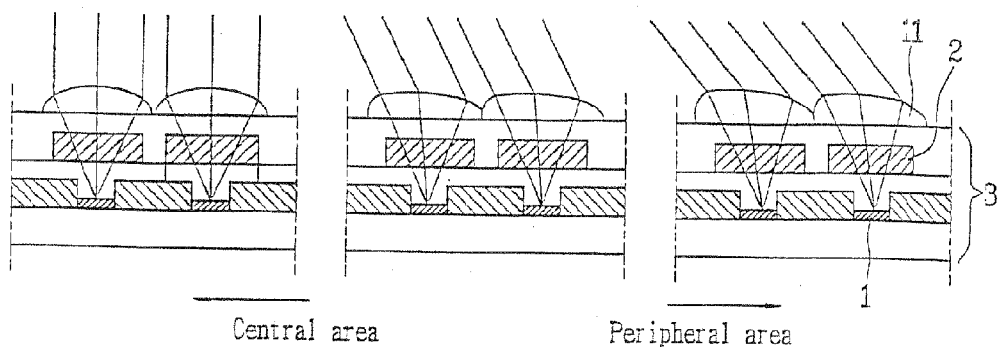
FIG. 13 illustrates an image sensor including an array of aspheric micro lenses in accordance with yet another embodiment of the present invention.

The method of FIG. 13 can advantageously improve optical efficiency as much as that of FIG. 12 according to a single process for fabricating aspheric micro lenses.

FIG. 13 illustrates the image sensor including the array of aspheric micro lenses 11 in accordance with yet another embodiment of the present invention.

As illustrated in FIG. 13, tangent lines to the corresponding parts of the incident surfaces have different gradients according to distances between the corresponding parts and the center of the image sensor, and thus aspheric micro lenses 11 in different shapes are arranged to convert optical paths of slantingly incident light and condense light to photoelectric elements 1. That is, the aspheric micro lens and aspheric micro reflecting mirror have different tangent line gradient values on individual parts of the incident surface of the same optical path conversion element to condense incident light to the photoelectric element. Therefore, the aspheric micro lenses 11 perform functions of micro prisms 10 as optical path conversion elements as well as functions of micro lenses 5 as condensers.

Differently from the micro prisms 10, tangent line gradients are different at each point on the incident surface of one aspheric micro lens 11. The tangent line gradients at each point can be calculated by formula (2).

FIGS. 8 to 13 show that we can improve optical efficiency of the image sensor by using the refraction law. The reflection law has the same effects as discussed later.

Figure 14:
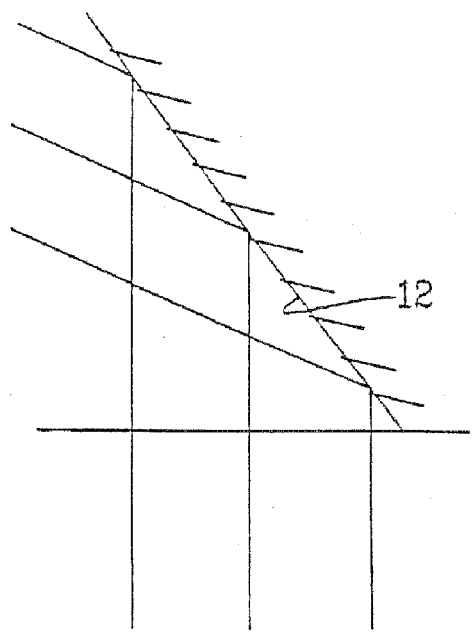
FIG. 14 is a concept view showing that a reflecting mirror can vary an optical path of light.

FIG. 14 is a concept view showing that a reflecting mirror 12 can vary an optical path of light.

Relations between an inclination angle of light incident on the surface of the reflecting mirror 12, an angle of reflected light and a gradient value of an incident surface of the reflecting mirror 12 will now be described with reference to FIG. 15.

Figure 15:
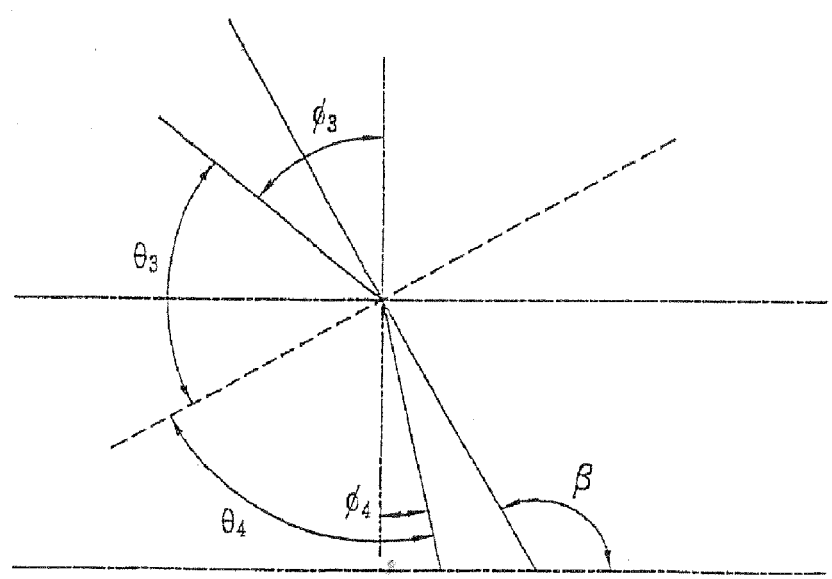
FIG. 15 illustrates the reflection law of light, especially light reflected by the reflecting mirror of FIG. 14.

FIG. 15 illustrates the reflection law of light, especially light incident on the reflecting mirror 12 of FIG. 14.

FIG. 15 shows an angle of reflected light when light is incident on the incident surface having a gradient of β. When it is presumed that an angle of incident light to a normal line of the incident surface is '$\theta_3$' and an angle of reflected light to a normal line of incident surface is '$\theta_4$', the reflection law is represented by formula (4):

$$\theta_3 = \theta_4 \qquad (4)$$

Here, when it is presumed that the gradient of the incident surface is 'β', an inclination angle of incident light to an optical axis is '$\phi_3$' and an angle of reflected light to the optical axis is '$\phi_4$', and they are introduced to formula (4), we can obtain following formula (5):

$$\beta = 90° + \frac{\phi_3 + \phi_4}{2} \quad (5)$$

The gradient β of the reflecting mirror 12 for making light reflected by the reflecting mirror 12 parallel to the optical axis ($\phi_4$=0) is represented by following formula (6) with regard to the gradient $\phi_3$ of incident light:

$$\beta = 90° + \frac{\phi_3}{2} \quad (6)$$

Figure 16:
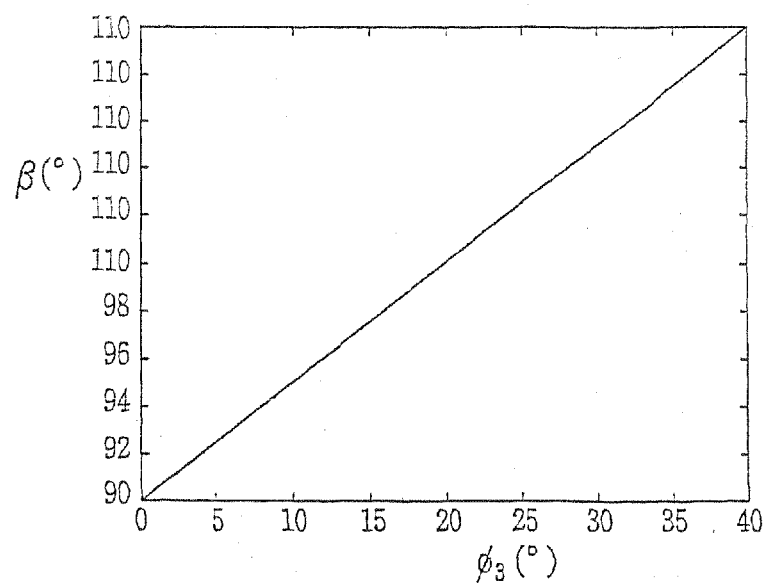
FIG. 16 illustrates relations between an inclination angle and a gradient value of an incident surface for making light reflected by the reflecting mirror parallel to an optical axis.

FIG. 16 illustrates relations between the inclination angle and the gradient value of the incident surface for making light reflected by the reflecting mirror 12 parallel to the optical axis.

Here, as the inclination angle increases, that is, in the peripheral pixels of the image sensor, the gradient of the incident surface of the reflecting mirror 12 increases, which will later be explained with reference to FIG. 17.

Figure 17:
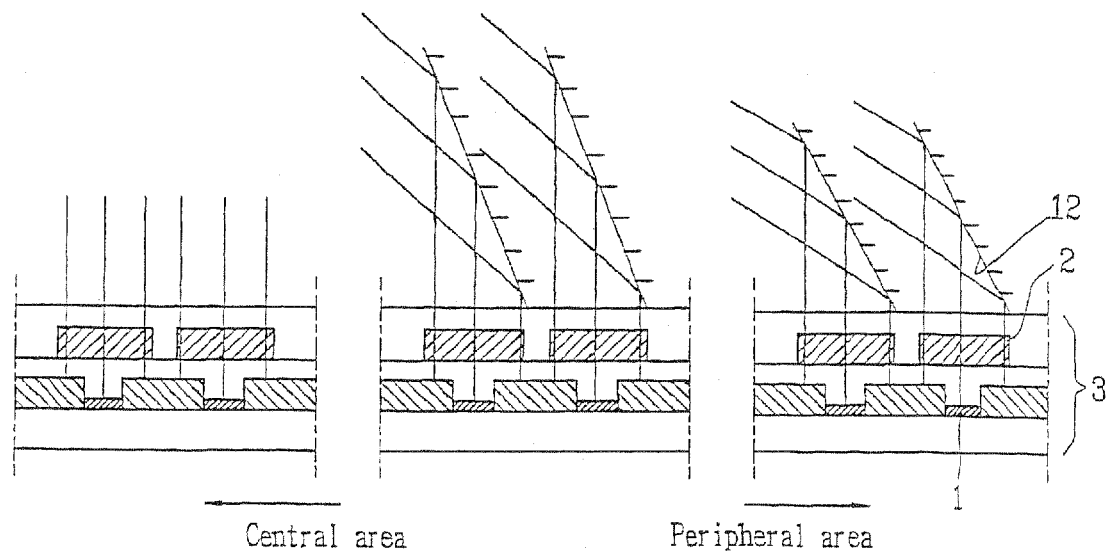
FIG. 17 illustrates an image sensor including an array of micro reflecting mirrors as optical path conversion elements in accordance with yet another embodiment of the present invention.

FIG. 17 illustrates an image sensor including an array of micro reflecting mirrors 12 as optical path conversion elements in accordance with yet another embodiment of the present invention.

The method of FIG. 17 reflects light incident at different angles on each pixel to be parallel to an optical axis by using the array of micro reflecting mirrors 12 having different incident surface gradients. This method equalizes angles of light incident on photoelectric elements 1, and thus equalizes amounts of light sensed in each position of the image sensor.

Figure 18:
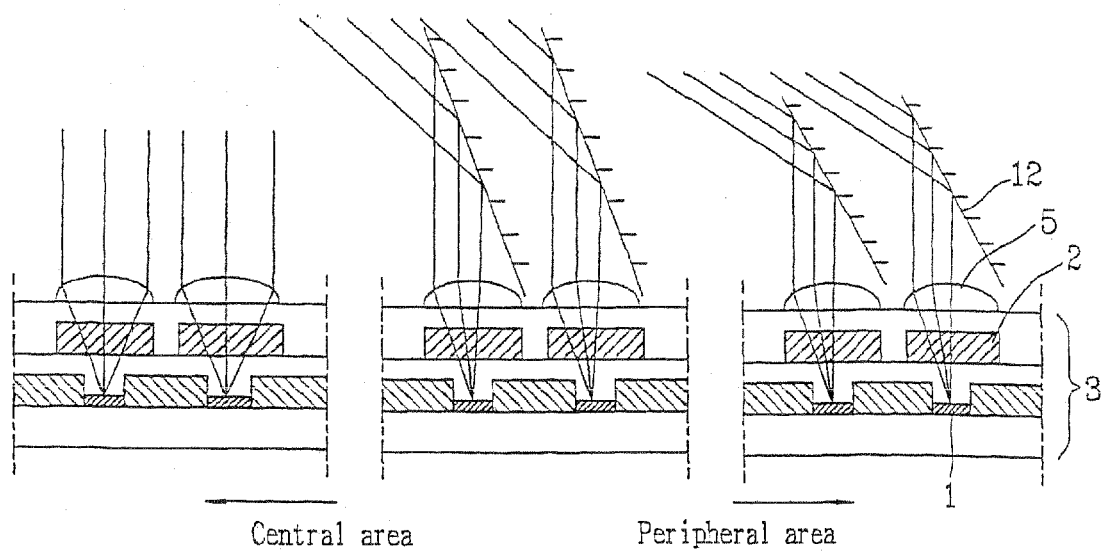
FIG. 18 illustrates an image sensor including an array of micro reflecting mirrors and an array of micro lenses as optical path conversion elements in accordance with yet another embodiment of the present invention.

FIG. 18 illustrates an image sensor including an array of micro reflecting mirrors 12 and an array of micro lenses 5 as optical path conversion elements in accordance with yet another embodiment of the present invention.

As shown in FIG. 18, the image sensor uses both the array of micro reflecting mirrors 12 and the array of micro lenses 5. Here, the array of micro reflecting mirrors 12 convert an optical path of light to be parallel to an optical axis, and the array of micro lenses 5 condense light to photoelectric elements 1. Accordingly, the method of FIG. 18 more efficiently senses light than the method of FIG. 17, and equalizes amounts of light sensed in each position.

Figure 19:
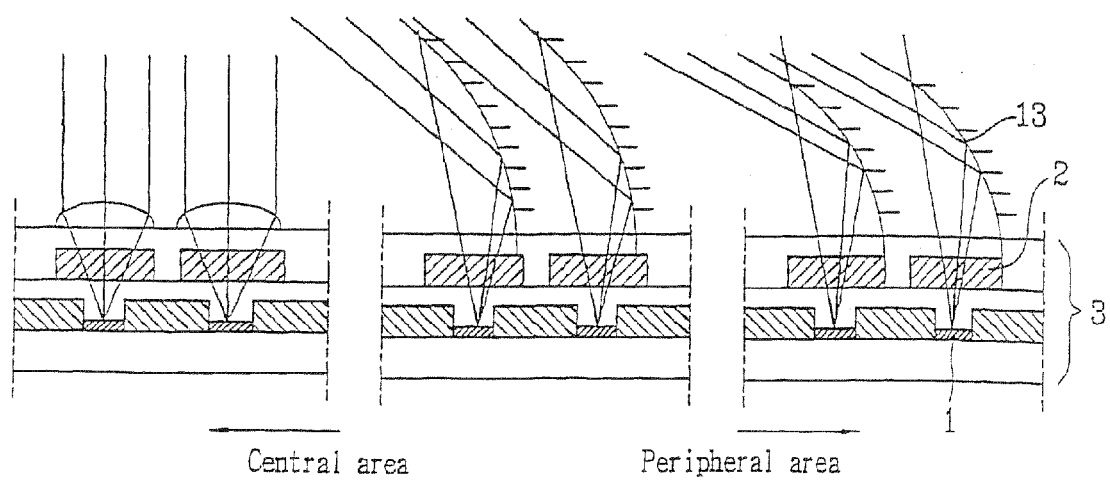
FIG. 19 illustrates an image sensor including an array of aspheric micro reflecting mirrors in accordance with yet another embodiment of the present invention.

FIG. 19 illustrates an image sensor including an array of aspheric micro reflecting mirrors 13 in accordance with yet another embodiment of the present invention.

Referring to FIG. 19, tangent lines to the corresponding parts of incident surfaces have different gradients according to angles of light incident on the surface of the image sensor, namely distances of each pixel from the center of the image sensor, and thus aspheric micro reflecting mirrors 13 in different shapes are arranged to convert optical paths of slantingly-incident light and condense light to photoelectric elements 1. That is, the aspheric micro reflecting mirrors 13 perform the functions of the optical path conversion element as well as the condenser.

Differently from the flat surface micro reflecting mirrors 12, tangent line gradients are different at each point on the incident surface of one aspheric micro reflecting mirror 13. The tangent line gradients at each point can be calculated by formula (5).

As discussed earlier, the image sensor of the invention includes optical path conversion elements having different tangent line gradients on the corresponding parts of incident surfaces according to distances between the corresponding parts and the center of the image sensor. It is therefore required to fabricate fine structures having various tangent line gradients. It is very difficult to fabricate the fine structures according to a single process using a conventional MEMS process.

Figure 20A:
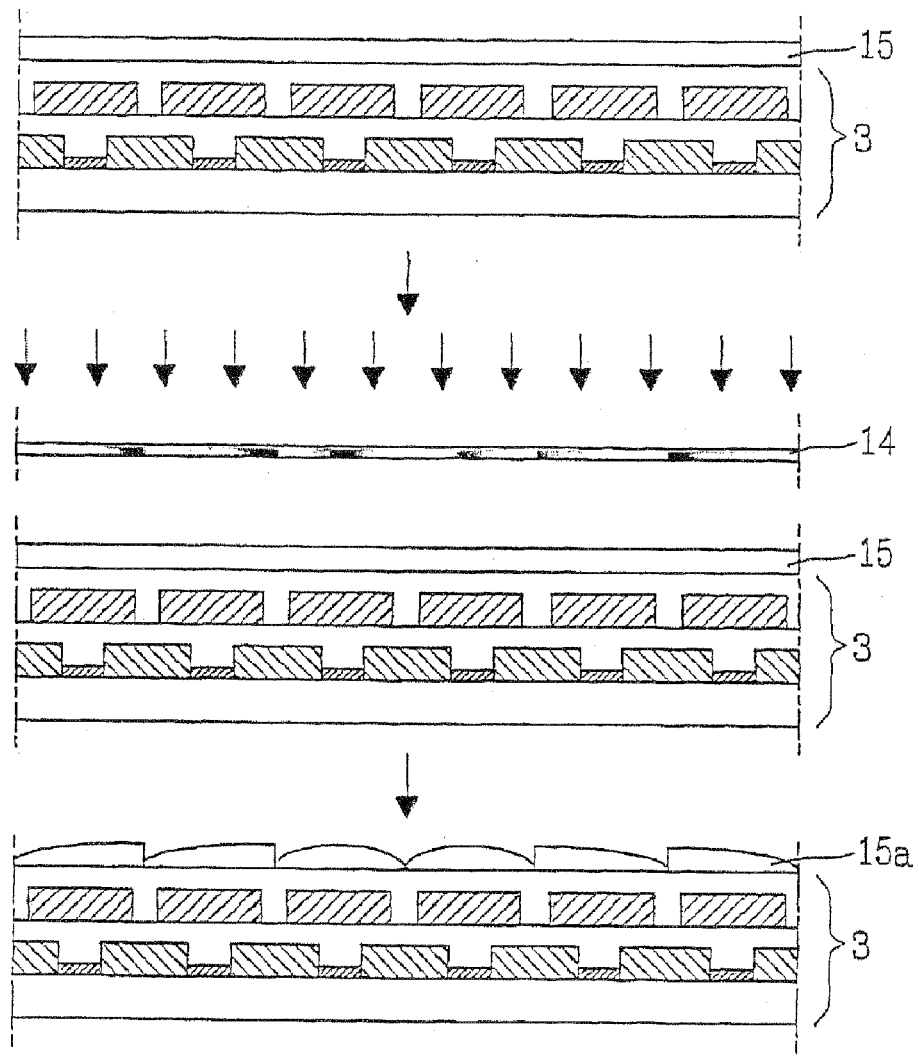
FIGS. 20a to 20c respectively illustrate processes for fabricating an image sensor in accordance with various embodiments of the present invention.
Figure 20B:
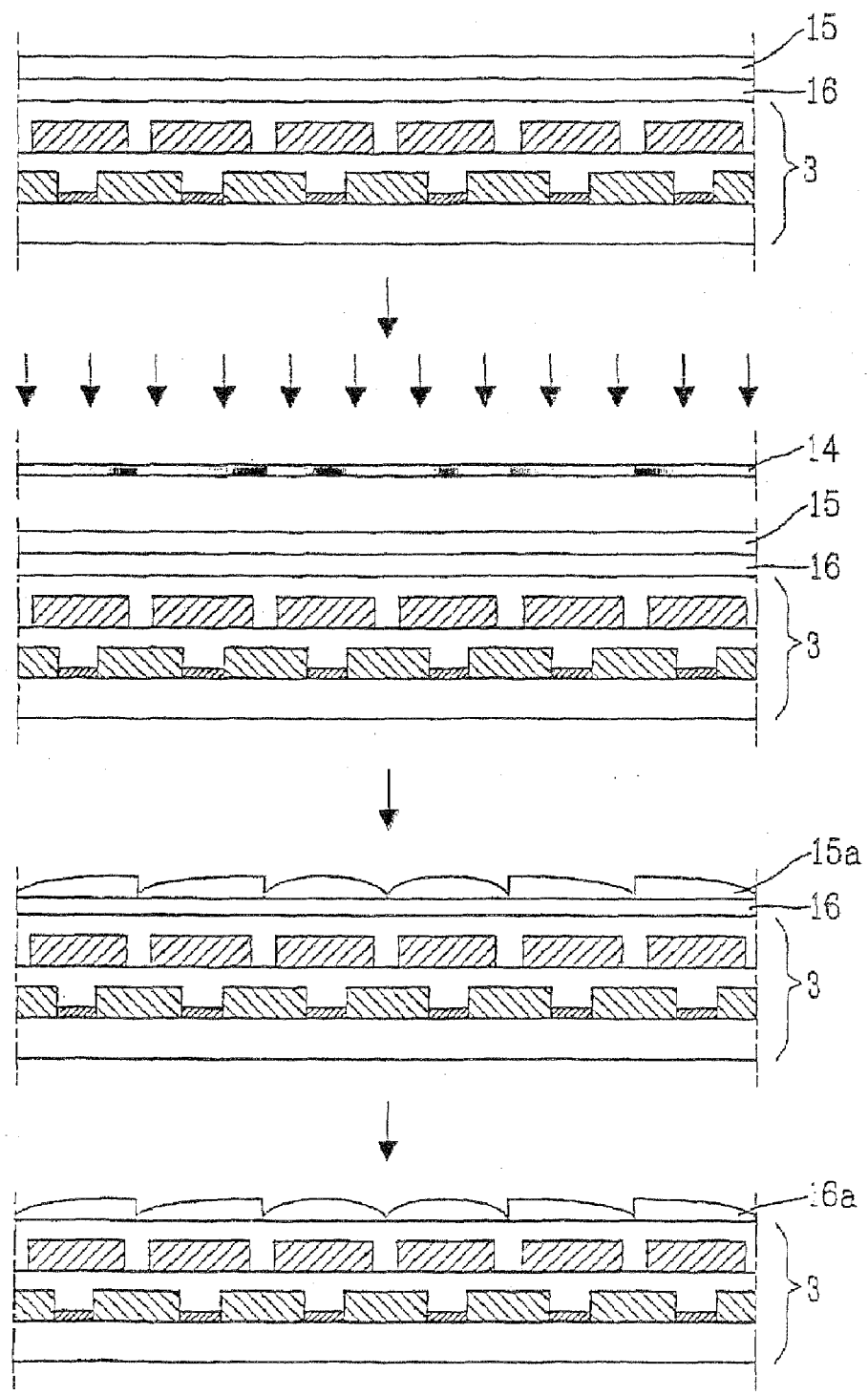
Figure 20C:
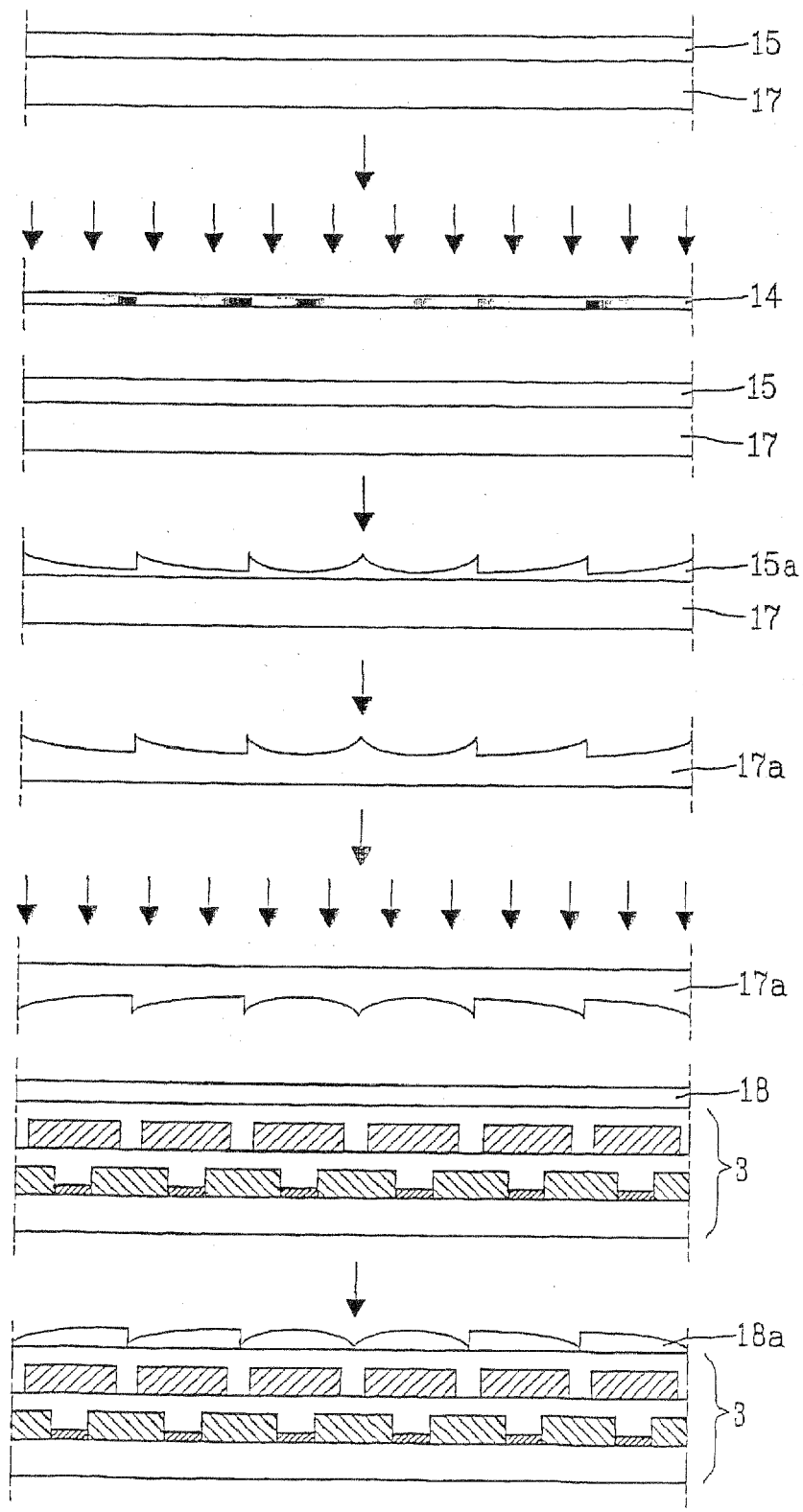

However, as shown in FIGS. 20*a* to 20*c*, the fine structures having various tangent line gradients can be easily fabricated according to a photolithography process using a gray scale mask, a reactive ion etching process and an UV-molding process.

FIG. 20*a* illustrates a process for fabricating an image sensor in accordance with yet another embodiment of the present invention.

As illustrated in FIG. 20*a*, a photoresist 15 is coated on a substrate 3 of the image sensor, and exposed to ultraviolet rays through a gray scale mask 14.

Thereafter, the photoresist 15 exposed to the ultraviolet rays is removed, to obtain photoresist fine structures 15*a* having various tangent line gradients.

FIG. 20*b* illustrates a process for fabricating an image sensor in accordance with yet another embodiment of the present invention.

As shown in FIG. 20*b*, fine structures 16*a* having different tangent line gradients are fabricated on a substrate 3 of the image sensor according to the photolithography process and the reactive ion etching process.

First, a material for the reactive ion etching process is positioned on the substrate 3. A photoresist 15 is coated on the resulting structure, and exposed to ultraviolet rays through a gray scale mask 14, to obtain photoresist fine structures 15*a*.

The fine structures 16*a* having different tangent line gradients are fabricated on the substrate 3 by etching the fine structures 15*a* according to the reactive ion etching process.

FIG. 20*c* illustrates a process for fabricating an image sensor in accordance with yet another embodiment of the present invention.

As depicted in FIG. 20*c*, the image sensor is fabricated according to the UV-molding process. A photoresist 15 is coated on an ultraviolet transparent material 17 for the reactive ion etching process. A mold 17*a* on which fine structures have been formed is fabricated according to the photolithography process using the gray scale mask and the reactive ion etching process.

A photopolymer 18 is applied on a substrate 3, and then the UV-molding process is performed thereon by using the mold 17*a*, to obtain fine structures 18*a* having various tangent line gradients.

The process for fabricating the image sensor of FIG. 12 according to the method of FIG. 20*c* will now be explained.

First, the micro lenses 5 are molded on the substrate 3 according to the process of FIG. 20*c*. The photopolymer is applied on the resulting structure, and then the flat layer and the micro prisms 10 are molded at the same time by using the mold 17*a* on which concave micro prism patterns 10 have been formed.

It is also possible to sequentially mold the flat layer by using a flat surface mold, and the micro prisms 10 by using the mold 17*a* on which the concave micro prism patterns 10 have been formed. However, this method may not be preferable in the number of processes.

The process for fabricating the image sensor of FIG. 17 according to the method of FIG. 20*c* will now be described.

A variety of processes can be used to fabricate the micro reflecting mirror 12 of FIG. 17. For example, fine structures having triangular sections are micro molded according to the UV-molding process, similarly to FIG. 11a. The outside surface of the slanting right side of the micro reflecting mirror 12 of FIG. 17 is coated. The inside surface of the slanting right side is used as a reflecting surface (incident surface of reflecting mirror 12). In this case, a refraction index of the fine structure is preferably almost identical to a refraction index of an air layer. Otherwise, differences between the refraction indexes of the fine structure and the air layer must be taken into consideration.

Figure 1:
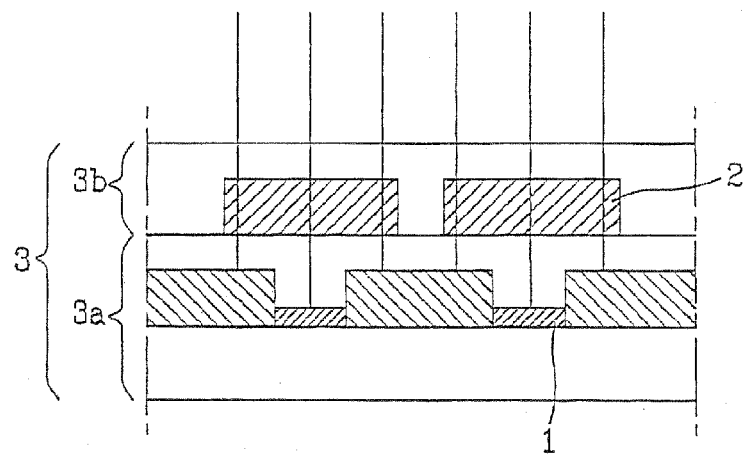
FIG. 1 illustrates a basic structure of a conventional image sensor, which does not have an array of micro lenses.
Figure 2:
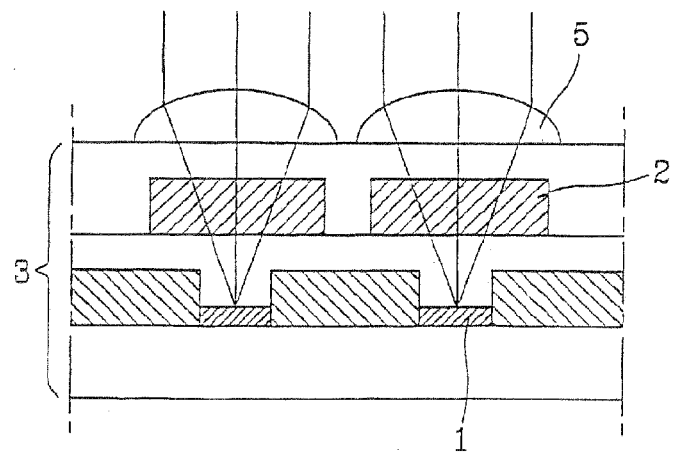
FIG. 2 illustrates a basic structure of a conventional image sensor including an array of micro lenses.
Figure 3:
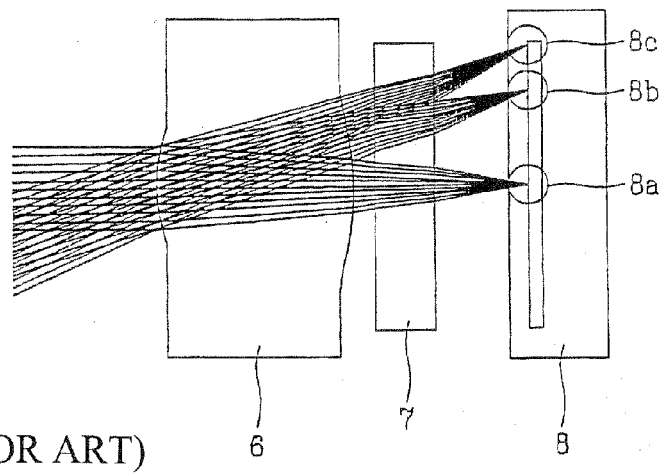
FIG. 3 illustrates one example of a system using an image sensor.
Figure 4:
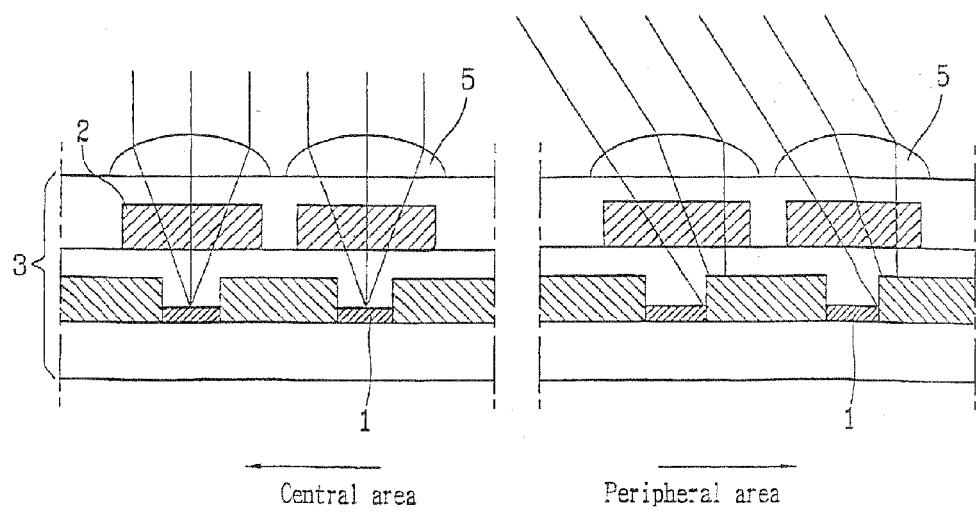
FIG. 4 illustrates low optical efficiency of peripheral pixels of the image sensor of FIG. 2.
Figure 5:
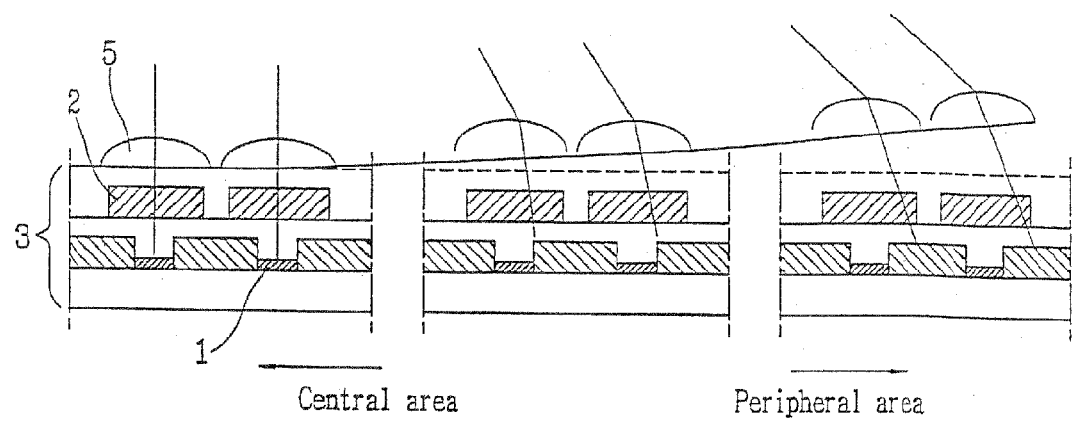
FIG. 5 illustrates another example of a conventional image sensor wherein micro lenses are arranged on different planes according to distances from the center of the image sensor.
Figure 6:
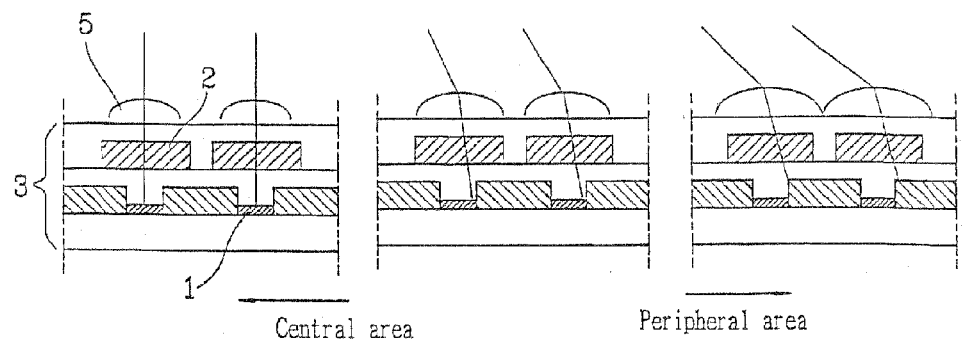
FIG. 6 illustrates yet another example of a conventional image sensor wherein micro lenses of different sizes are arranged according to distances from the center of the image sensor.
Figure 7:
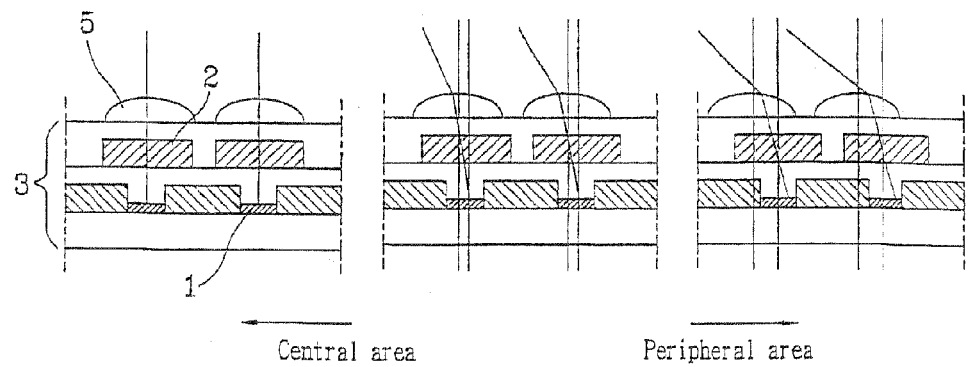
FIG. 7 illustrates yet another example of a conventional image sensor wherein micro lenses are arranged in deviated positions from photoelectric elements according to distances from the center of the image sensor.
Figure 21A:
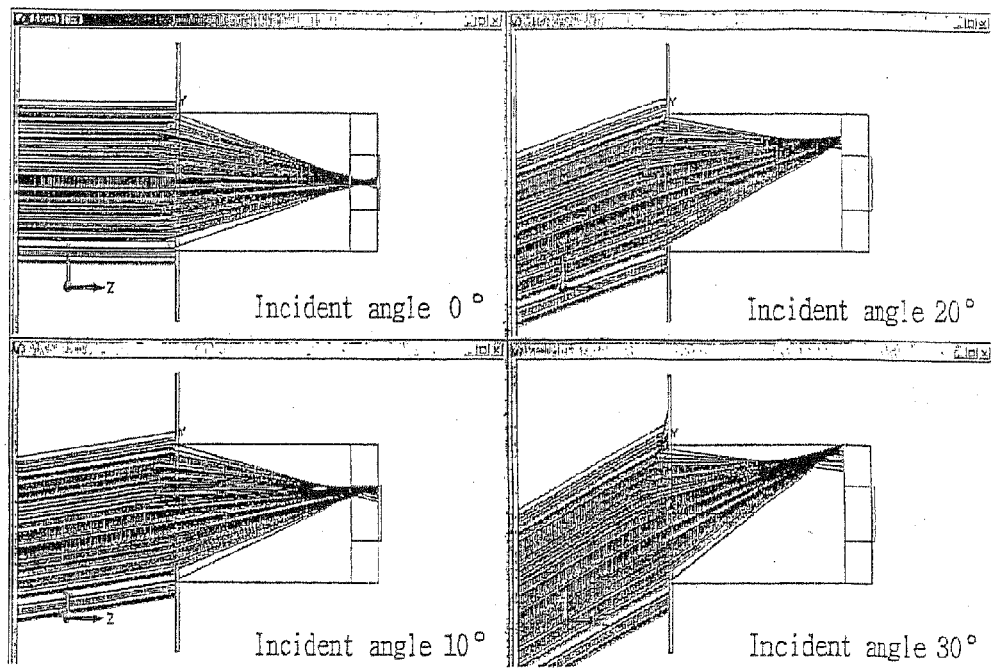
Figure 21B:
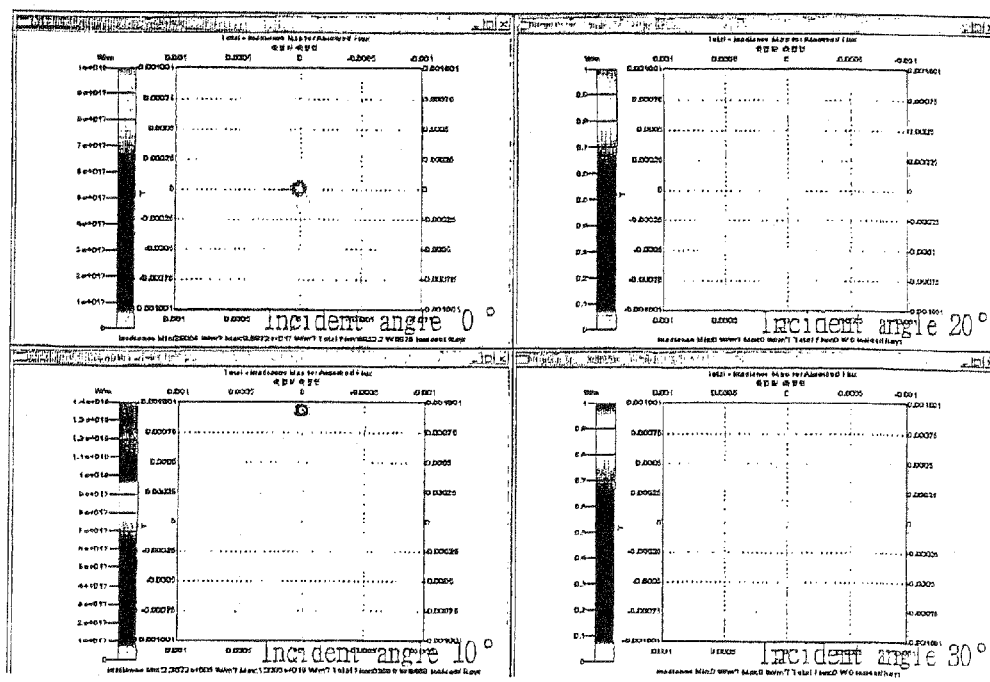

FIGS. 21a and 21b illustrate simulation results for the image sensor including the array of micro lenses 5 in FIG. 2. Here, FIG. 21a shows the optical path of light, and FIG. 21b shows distribution of light intensity in the photoelectric element 1.

For simulations, it is presumed that the size of cells of the image sensor is 5 μm×5 μm the size of photodiodes is 2 μm×2 μm the thickness of a circuit part surrounding the photodiode is 1 μm, and the thickness from the micro lenses 5 to the photodiodes is 8 μm.

Referring to FIGS. 21a and 21b, if the array of micro prisms 10 does not exist and the inclination angle of light is 0 or 10°, the focus is formed on the photodiodes and thus the photodiodes can sense light. However, if the array of micro prisms 10 does not exist and the inclination angle of light is 20 or 30°, the photodiodes cannot sense light.

Even if the inclination angle of light is 10°, the photodiodes having small area cannot sense a lot of light.

Figure 22A:
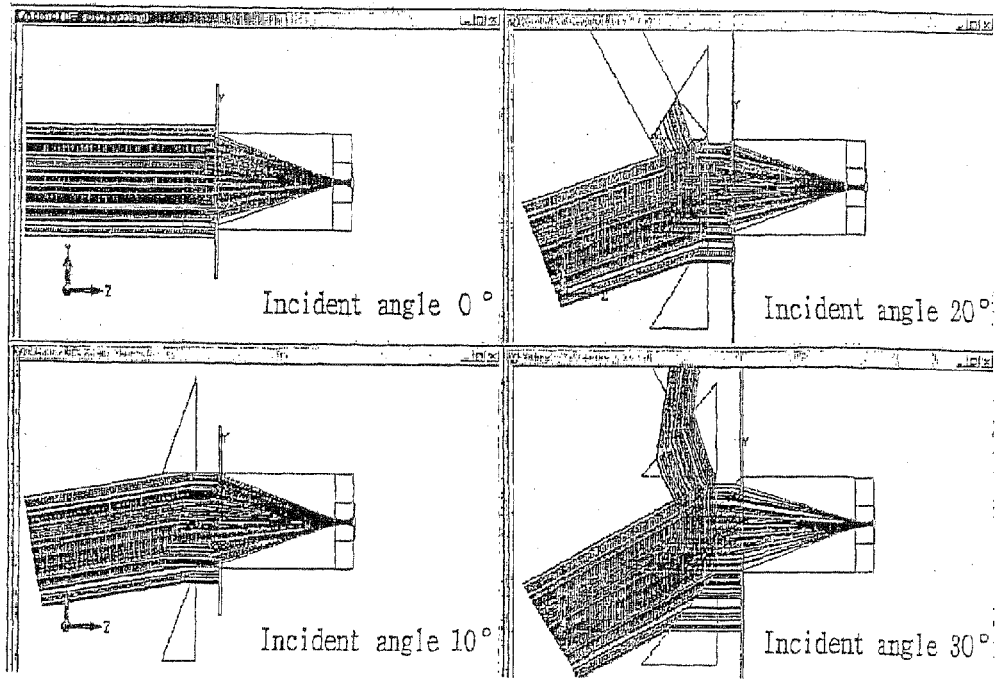
Figure 22B:
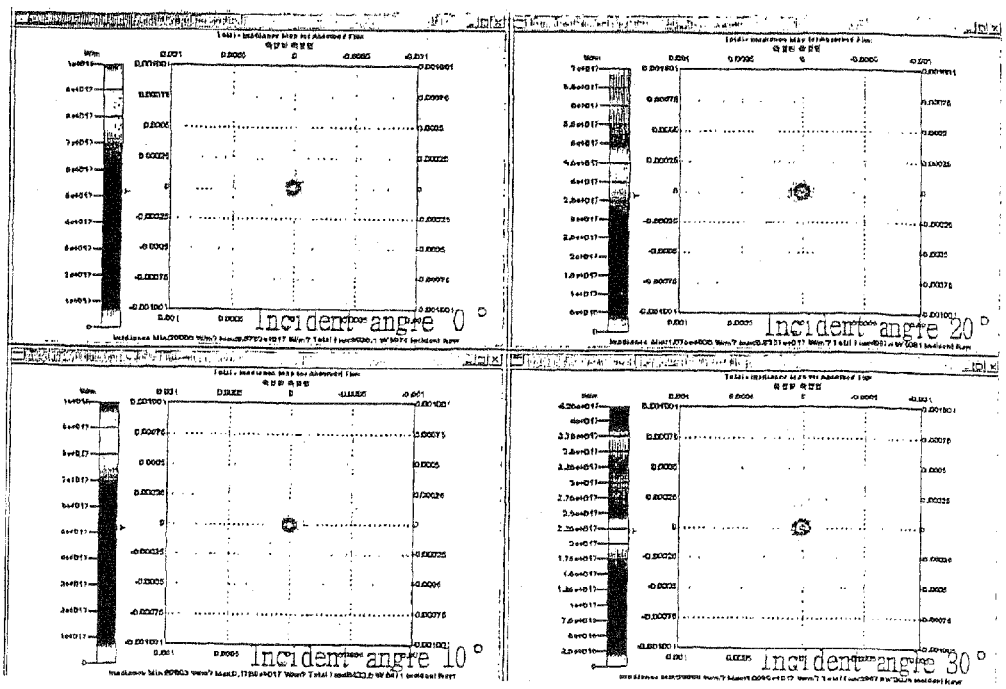

FIGS. 22a and 22b illustrate simulation results for the image sensor including the array of micro prisms 10 and the array of micro lenses 5 in FIG. 12. Here, FIG. 22a shows the optical path of light, and FIG. 22b shows distribution of light intensity in the photoelectric element 1.

As shown in FIGS. 22a and 22b, if the array of micro prisms 10 and the array of micro lenses 5 exist and an inclination angle of light is 0, 10, 20 or 30°, the focus is formed on the photodiodes and thus the photodiodes can sense light.

On the Basis of an amount of light sensed by the photodiodes at an inclination angle of 0°, when the micro prism arrangements 10 do not exist and exist, condensation efficiency is 92% and 93% respectively at an inclination angle of 10°; 0% and 90% respectively at an inclination angle of 20°; and 0% and 76% respectively at an inclination angle of 30°.

Accordingly, even when the inclination angle of light incident on the image sensor is large, the micro prisms 10 can make the photodiodes of the image sensor efficiently sense light.

Although the preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. The image sensor comprising:
   a substrate in which an array of photoelectric elements is formed; and
   an array of optical path conversion elements for converting optical paths of incident light formed at a light incident side of the substrate so that the optical path converted light may be incident on the substrate, each optical path conversion element being formed to match with each photoelectric element,
   wherein the optical path conversion elements are selected from the group consisting of aspheric micro lenses and aspheric micro reflecting mirrors, the aspheric micro lenses and aspheric micro reflecting mirror having different tangent line gradient values on individual parts of an incident surface of the same optical path conversion element to condense incident light to the photoelectric element, and
   the incident surface of each optical path conversion element has a tangent line gradient value to convert the optical path of light incident slantingly on a peripheral area of the image sensor at a larger inclination angle as the peripheral area is away from the center of the image sensor to be identical with the optical path of light incident vertically on a central area of the image sensor to counterbalance the inclination angle of light incident on the peripheral area of the image sensor, tangent line gradient values of corresponding parts of the incident surfaces of the optical path conversion elements at an identical distance from the respective matching photoelectric elements being different from one another according to distances between the corresponding parts and the center of the image sensor.

2. The image sensor of claim 1, wherein the centers of the optical path conversion elements are offset from the centers of the matching photoelectric elements according to the distances from the center of the image sensor.

3. The image sensor of claim 1, wherein, when the single image sensor is divided into a plurality of regions according to the distances from its center, the optical path conversion elements in the same region have the identical tangent line gradient value on the corresponding parts of the incident surfaces, but the optical path conversion elements in the different regions have different tangent line gradient values on the corresponding parts of the incident surfaces according to the distances from the center of the image sensor.

4. The image sensor of claim 1, which comprises both the aspheric micro lens type optical path conversion elements and the aspheric micro reflecting mirror type optical path conversion elements.

5. The image sensor of claim 4, wherein the centers of the optical path conversion elements are offset from the centers of the matching photoelectric elements according to the distances from the center of the image sensor.

6. The image sensor of claim 4, wherein, when the single image sensor is divided into a plurality of regions according to the distances from its center, the optical path conversion elements in the same region have the identical tangent line gradient value on the corresponding parts of the incident surfaces, but the optical path conversion elements in the different regions have different tangent line gradient values on the corresponding parts of the incident surfaces according to the distances from the center of the image sensor.

7. The image sensor of claim 1, wherein, when it is presumed that a refraction index of a layer contacting the incident surface of the aspheric micro lens is '$n_1$' the inclination angle between light incident on the incident surface of the aspheric micro lens and the optical axis is '$\phi_1$', a refraction index of the aspheric micro lens is '$n_2$', and an angle of refracted light to the optical axis for light incident to one point on the incident surface of the aspheric micro lens to be refracted by the aspheric micro lens and condensed to the photoelectric element is '$\phi_2$', a tangent line gradient α at the point on the incident surface of the aspheric micro lens is represented by following formula:

$$\alpha = \tan^{-1}\left(\frac{n_1\sin\phi_1 - n_2\sin\phi_2}{n_1\cos\phi_1 - n_2\cos\phi_2}\right).$$

8. The image sensor of claim 7, wherein the centers of the optical path conversion elements are offset from the centers of the matching photoelectric elements according to the distances from the center of the image sensor.

9. The image sensor of claim 7, wherein, when the single image sensor is divided into a plurality of regions according to the distances from its center, the optical path conversion elements in the same region have the identical tangent line gradient value on the corresponding parts of the incident surfaces, but the optical path conversion elements in the different regions have different tangent line gradient values on the corresponding parts of the incident surfaces according to the distances from the center of the image sensor.

10. The image sensor of claim 1, wherein, when it is presumed that the inclination angle between light incident on the incident surface of the aspheric micro reflecting mirror and the optical axis is '$\phi_3$', and an angle of reflected light to the optical axis for light incident to one point on the incident surface of the aspheric micro reflecting mirror to be reflected by the aspheric micro reflecting mirror and condensed to the photoelectric element is '$\phi_4$', a tangent line gradient β at the point on the incident surface of the aspheric micro reflecting mirror is represented by following formula:

$$\beta = 90° + \frac{\phi_3 + \phi_4}{2}.$$

11. The image sensor of claim 10, wherein the centers of the optical path conversion elements are offset from the centers of the matching photoelectric elements according to the distances from the center of the image sensor.

12. The image sensor of claim 10, wherein, when the single image sensor is divided into a plurality of regions according to the distances from its center, the optical path conversion elements in the same region have the identical tangent line gradient value on the corresponding parts of the incident surfaces, but the optical path conversion elements in the different regions have different tangent line gradient values on the corresponding parts of the incident surfaces according to the distances from the center of the image sensor.

* * * * *